US012796131B2

(12) United States Patent
Choi et al.

(10) Patent No.: US 12,796,131 B2
(45) Date of Patent: Nov. 10, 2026

(54) IMAGE SENSOR

(71) Applicant: DB HiTek Co., Ltd., Bucheon-si (KR)

(72) Inventors: Woo Sung Choi, Cheongju-si (KR); Man Lyun Ha, Mungyeong-si (KR); Ju Hwan Jung, Seoul (KR)

(73) Assignee: DB HiTek Co., Ltd., Bucheon-si (KR)

( * ) Notice: Subject to any disclaimer, the term of this patent is extended or adjusted under 35 U.S.C. 154(b) by 335 days.

(21) Appl. No.: 18/598,464

(22) Filed: Mar. 7, 2024

(65) Prior Publication Data

US 2025/0169209 A1 May 22, 2025

(30) Foreign Application Priority Data

Nov. 16, 2023 (KR) ........................ 10-2023-0158881

(51) Int. Cl.
*H10F 39/18* (2025.01)
*H10F 39/00* (2025.01)
*H10F 39/12* (2025.01)

(52) U.S. Cl.
CPC ..... *H10F 39/80373* (2025.01); *H10F 39/182* (2025.01); *H10F 39/199* (2025.01)

(58) Field of Classification Search
CPC ......................... H10F 39/199; H10F 39/80373
See application file for complete search history.

(56) References Cited

U.S. PATENT DOCUMENTS

2022/0360731 A1 * 11/2022 Kim ..................... H04N 25/771

FOREIGN PATENT DOCUMENTS

KR 10-0660549 B1 12/2006
KR 10-2010-0025873 A 3/2010
KR 10-2018-0004336 A 1/2018

* cited by examiner

*Primary Examiner* — Molly K Reida
(74) *Attorney, Agent, or Firm* — Bridgeway IP Law Group, PLLC; Jihun Kim

(57) ABSTRACT

An image sensor has a gate that is electrically connected to a wiring layer and is formed at a side that overlaps a photodiode or storage diode in a semiconductor layer, so that an electrical charge can be easily transferred to a floating diode. The image sensor comprises: a semiconductor layer having a front surface and a back surface; a photodiode and a floating diode disposed apart from each other in the semiconductor layer; a first gate disposed on the front surface of the semiconductor layer and in an insulating layer; a second gate disposed on the front surface of the semiconductor layer and in the insulating layer, the second gate being configured to serve as a transfer transistor; the insulating layer disposed on the front surface of the semiconductor layer; and a wiring layer disposed in the insulating layer.

8 Claims, 5 Drawing Sheets

IMAGE SENSOR

CROSS-REFERENCE TO RELATED APPLICATION

The present application claims priority to Korean Patent Application No. 10-2023-0158881, filed Nov. 16, 2023, the entire contents of which is incorporated herein for all purposes by this reference.

BACKGROUND OF THE INVENTION

Field of the Invention

The present disclosure relates to an image sensor. More particularly, the present disclosure relates to an image sensor, in which a gate electrically connected to a wiring layer is formed in a semiconductor layer at a side that overlaps a photodiode or storage diode, so that an electrical charge can be easily transferred to a floating diode.

Description of the Related Art

An image sensor is a component of an image-capturing device that generates an image in a mobile phone camera or the like. Image sensors can be classified into a charge coupled device (CCD) image sensor and a complementary metal oxide semiconductor (CMOS) image sensor, depending on manufacturing processes and applications. The CMOS image sensor is a sensor that receives incident light through a photodiode and then converts it into digital image data through a data conversion process. An electrical charge generated by the incident light is stored in the photodiode, and the stored electrical charge is output as an output signal in accordance with designed timing.

Therefore, charge transfer efficiency is one of the important parameters in transferring the electrical charge stored in the photodiode to an output signal stage. For this purpose, a method of easily transferring the electrical charge stored in the photodiode to a next node, which is a floating diode, by a control signal applied to a transfer gate is widely used. Here, when a pixel size is large, the distance from an end of the photodiode to the transfer gate becomes relatively long, which reduces the charge transfer efficiency. To solve this, the development of a new pixel design and doping profile is required.

FIG. 1 is a sectional view illustrating a conventional image sensor 9.

Referring to FIG. 1, when an exposure of a photodiode 910 of the conventional image sensor 9 is first started, the photodiode 910 converts incident light into an electrical charge and accumulates the electrical charge. Thereafter, a transfer gate 920 is turned on in response to a control signal, and the electrical charge accumulated in the photodiode 910 is transferred to a floating diode 930 and is stored. Here, when a unit pixel region has a large size, that is, when the photodiode 910 has a width of a certain size or more, there is a limitation in transferring the electrical charge accumulated in the photodiode 910 far from the transfer gate 920 to the floating diode 930. In other words, as the charge transfer path becomes longer, the charge transfer efficiency undesirably decreases.

To prevent this, when a pinning layer (not illustrated) is formed in the photodiode 910 through an ion implantation process, a loss in the area of the photodiode 910 is inevitable due to the pinning layer.

To overcome the above problems, the inventors of the present disclosure have proposed a novel image sensor having an improved structure, which will be described in detail later.

The foregoing is intended merely to aid in the understanding of the background of the present disclosure, and is not intended to mean that the present disclosure falls within the purview of the related art that is already known to those skilled in the art.

Documents of Related Art (Patent document 1) Korean Patent No. 10-0660549 “Image sensor and method of manufacturing the same”

SUMMARY OF THE INVENTION

Accordingly, the present disclosure has been made keeping in mind the above problems occurring in the related art, and an objective of the present disclosure is to provide a backside-illuminated image sensor, in which a first gate having a varying thickness is formed under a photodiode, so that an electrical charge stored in the photodiode can be easily transferred to a floating diode when the first gate is turned on.

Another objective of the present disclosure is to provide a backside-illuminated image sensor, in which a stepped portion is formed on a surface of a first insulating layer, so that it is possible to easily vary the thickness of the first insulating layer.

Another objective of the present disclosure is to provide a backside-illuminated image sensor, in which a pinning layer is formed by a turn-on operation of a first gate rather than by an ion implantation process, so that a loss in the area of a photodiode can be prevented.

Another objective of the present disclosure is to provide a frontside-illuminated image sensor, in which a second gate having a varying thickness is formed on a storage diode, so that an electrical charge stored in the storage diode can be easily transferred to a floating diode when the second gate is turned on.

Another objective of the present disclosure is to provide a frontside-illuminated image sensor, in which a stepped portion is formed on a surface of a second insulating layer, so that it is possible to easily vary the thickness of the second insulating layer.

Another objective of the present disclosure is to provide a frontside-illuminated image sensor, in which a pinning layer is formed by a turn-on operation of a second gate rather than by an ion implantation process, so that a loss in the area of a photodiode can be prevented.

In order to achieve the above objectives, according to one aspect of the present disclosure, there is provided an image sensor, including: a semiconductor layer having a front surface and a back surface; a photodiode and a floating diode disposed apart from each other in the semiconductor layer; a first gate disposed on the front surface of the semiconductor layer and in an insulating layer; a second gate disposed on the front surface of the semiconductor layer and in the insulating layer, the second gate being configured to serve as a transfer transistor; the insulating layer disposed on the front surface of the semiconductor layer; and a wiring layer disposed in the insulating layer.

According to another aspect of the present disclosure, the first gate may be disposed on a front surface of the photodiode.

According to another aspect of the present disclosure, the second gate may be disposed in the insulating layer between the photodiode and the floating diode.

According to another aspect of the present disclosure, the first gate may include: a first insulating layer disposed on the front surface of the semiconductor layer; and a first gate electrode disposed on a surface of the first insulating layer. The surface of the first insulating layer may not be flat.

According to another aspect of the present disclosure, the first insulating layer may have a largest vertical thickness at an end of the first insulating layer adjacent to the floating diode.

According to another aspect of the present disclosure, the surface of the first insulating layer may have a stepped shape.

According to another aspect of the present disclosure, the surface of the first insulating layer may have a stepped portion stepped at a predetermined position.

According to another aspect of the present disclosure, the image sensor may further include: a pinning layer disposed on the front surface of the photodiode.

According to another aspect of the present disclosure, the pinning layer may have a formation depth that becomes shallower toward the floating diode.

According to another aspect of the present disclosure, the image sensor may further include: a color filter disposed on the back surface of the semiconductor layer; a planarization layer disposed on the color filter; and a lens disposed on the planarization layer.

According to another aspect of the present disclosure, there is provided an image sensor, including: a semiconductor layer having a front surface and a back surface; a photodiode disposed in the semiconductor layer; a floating diode disposed apart from the photodiode in the semiconductor layer; a storage diode disposed between the photodiode and the floating diode in the semiconductor layer; an insulating layer disposed on the front surface of the semiconductor layer; a first gate disposed on the front surface of the semiconductor layer and in the insulating layer, the first gate being configured to serve as a transfer transistor; a second gate disposed on the front surface of the semiconductor layer and in the insulating layer, the second gate overlapping the storage diode; and a third gate disposed on the front surface of the semiconductor layer and in the insulating layer, the third gate being configured to serve as a reset transistor.

According to another aspect of the present disclosure, the first gate may be disposed in the insulating layer between the photodiode and the storage diode.

According to another aspect of the present disclosure, the third gate may be disposed in the insulating layer between the storage diode and the floating diode.

According to another aspect of the present disclosure, the second gate may include: a second insulating layer disposed on the front surface of the semiconductor layer; and a second gate electrode disposed on a surface of the second insulating layer. The second insulating layer may have a vertical thickness that increases as the second insulating layer extends in a direction away from the first gate toward the third gate.

According to another aspect of the present disclosure, the surface of the second insulating layer may have a plurality of stepped portions disposed apart from each other.

According to another aspect of the present disclosure, the first gate may include a first insulating layer and a first gate electrode and the third gate may include a third insulating layer and a third gate electrode, wherein the first insulating layer and the third insulating layer may have a substantially uniform vertical thickness and the first gate electrode and the third gate electrode may have another substantially uniform vertical thickness.

According to another aspect of the present disclosure, the image sensor may further include: a wiring layer disposed in the insulating layer; a color filter disposed on a front surface of the insulating layer; and a lens disposed on the color filter.

According to another aspect of the present disclosure, there is provided an image sensor, including: a semiconductor layer having a front surface and a back surface; a photodiode and a floating diode disposed apart from each other in the semiconductor layer; an insulating layer disposed on the semiconductor layer; a wiring layer disposed in the insulating layer; and a first gate and a transfer gate disposed in the insulating layer between the wiring layer and an interface between the insulating layer and the semiconductor layer.

According to another aspect of the present disclosure, the first gate may include: a first insulating layer; and a first gate electrode disposed on a surface of the first insulating layer. The surface of the first insulating layer may not be flat.

The present disclosure has the following effects by the above configuration.

By forming the first gate having a varying thickness under the photodiode, an electrical charge stored in the photodiode can be easily transferred to the floating diode when the first gate is turned on.

In addition, by forming the stepped portion on the surface of the first insulating layer, it is possible to easily vary the thickness of the first insulating layer.

In addition, by forming the pinning layer by the turn-on operation of the first gate rather than by the ion implantation process, a loss in the area of the photodiode can be prevented.

In addition, by forming the second gate having a varying thickness on the storage diode, the electrical charge stored in the storage diode can be easily transferred to the floating diode when the second gate is turned on.

In addition, by forming the stepped portion on the surface of the second insulating layer, it is possible to easily vary the thickness of the second insulating layer.

In addition, by forming the pinning layer by the turn-on operation of the second gate rather than by the ion implantation process, a loss in the area of the photodiode can be prevented.

Meanwhile, the effects of the present disclosure are not limited to those mentioned above, and other effects not mentioned above can be clearly understood from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those ordinarily skilled in the art.

When a certain embodiment may be implemented differently, a specific process order may be performed differently from the described order. For example, two consecutively described processes may be performed substantially at the same time or performed in an order opposite to the described order.

It should be noted that an image sensor according to the present disclosure is applicable to both a frontside-illuminated image sensor as well as a backside-illuminated image sensor.

In the image sensor according to the present disclosure, a pixel region P and a peripheral region may be formed. The pixel region P is a region that absorbs light incident from the outside, and the peripheral region is a region that forms the periphery of the pixel region P. The pixel region P may include a plurality of unit pixel regions P1. In addition, a PAD (not illustrated) may be formed in the peripheral region for electrical connection to an external terminal. Hereinafter, for convenience of explanation, only the pixel region P of the image sensor according to the present disclosure will be described in detail.

Figure 2:
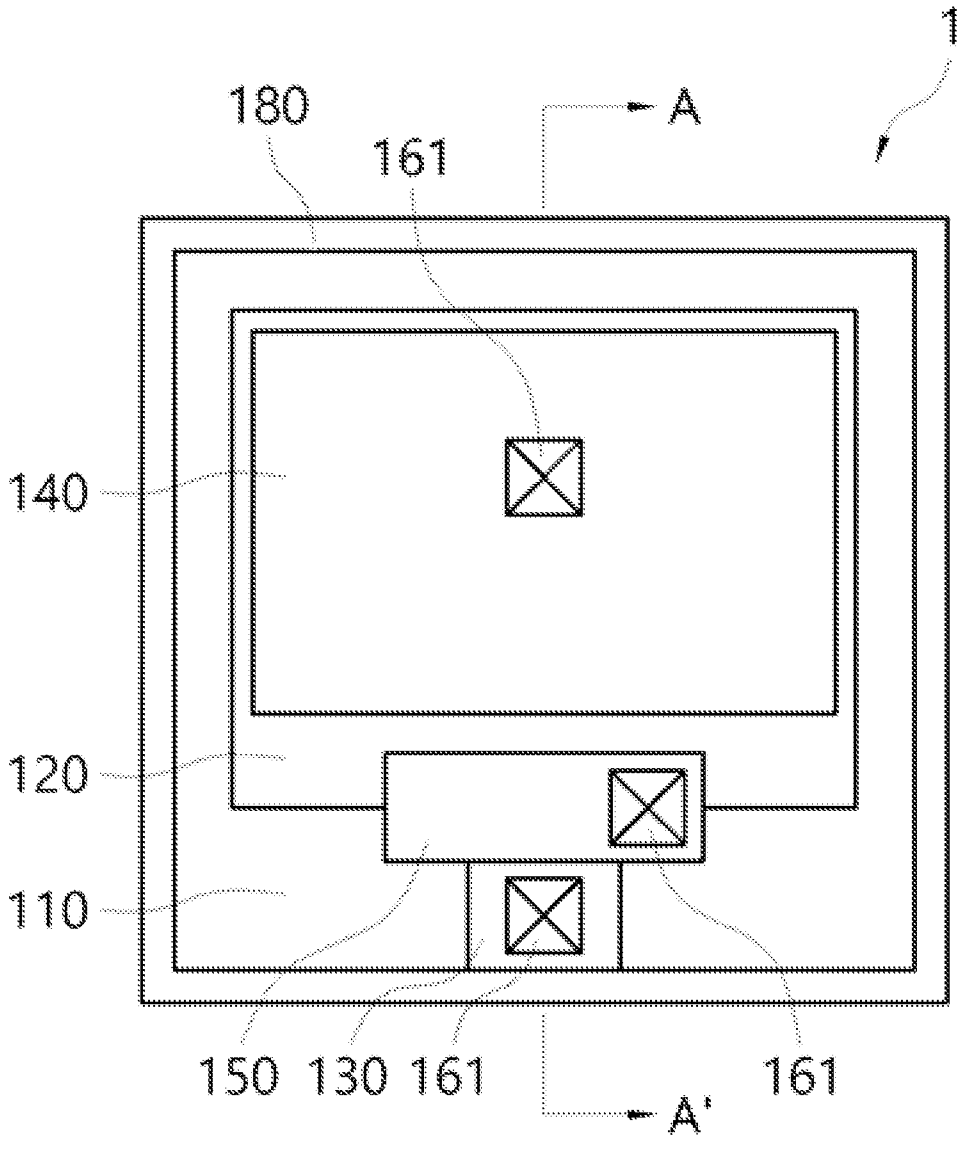
FIG. 2 is a bottom view illustrating an image sensor according to a first embodiment of the present disclosure.
Figure 3:
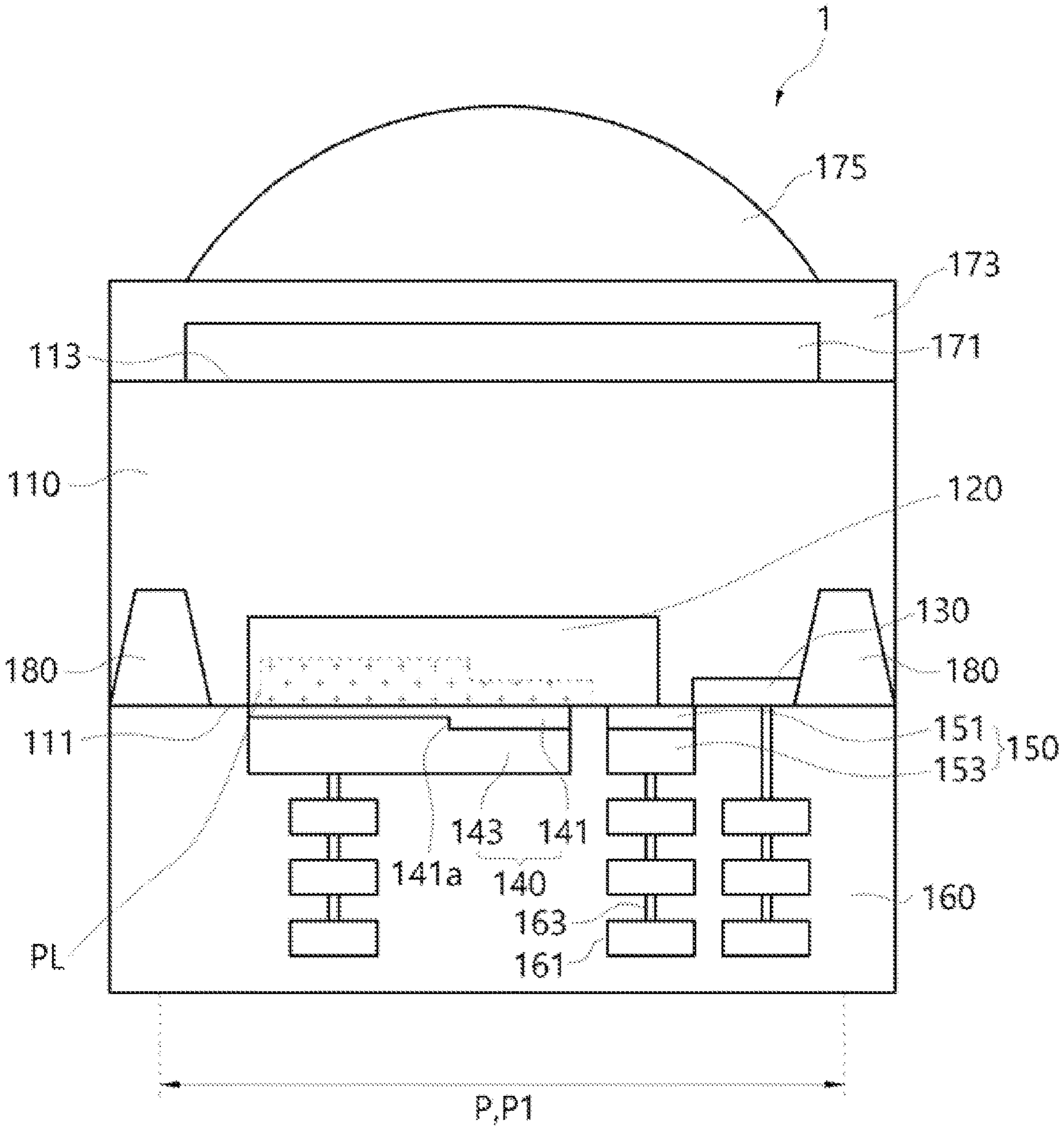
FIG. 3 is a sectional view taken along line A-A' of FIG. 2.

FIG. 2 is a bottom view illustrating an image sensor 1 according to a first embodiment of the present disclosure. FIG. 3 is a sectional view taken along line A-A' of FIG. 2. In FIG. 2, for convenience of explanation, the structures of an insulating layer, a contact plug, a color filter part, a planarization layer, and a lens part are omitted.

Hereinafter, the image sensor 1 according to the first embodiment of the present disclosure will be described in detail with reference to the accompanying drawings. It should be noted that the image sensor 1 according to the first embodiment is a backside-illuminated image sensor.

Referring to FIGS. 2 and 3, the present disclosure relates to a backside-illuminated image sensor 1. More particularly, the present disclosure relates to a backside-illuminated image sensor 1, in which a first gate 140 with a varying thickness is formed under a photodiode 120, so that an electrical charge stored in the photodiode 120 can be easily transferred to a floating diode 130.

The structure of the backside-illuminated image sensor 1 according to the first embodiment of the present disclosure will be described with reference to FIG. 3. First, a semiconductor layer 110 may be formed. The semiconductor layer 110 may include, for example, an epitaxial layer, and may be commonly applied to each unit pixel region P1. The semiconductor layer 110 may be, for example, a low concentration P-type layer formed on a substrate and may have a front surface 111 and a back surface 113. In addition, a device isolation layer 180 is formed in the semiconductor layer 110 to define an active region. The device isolation layer 180 may be formed through, for example, a shallow trench isolation (STI) process, and may be formed to extend to a predetermined depth from the front surface 111 of the semiconductor layer 110 toward the back surface 113 thereof.

In addition, in each unit pixel region P1, the photodiode 120 and the floating diode 130 may be formed in the semiconductor layer 110, and the photodiode 120 and the floating diode 130 may be formed on the front surface 111 of the semiconductor layer 110. The photodiode 120 and the floating diode 130 may be spaced apart from each other. Here, the photodiode 120 may generate an electrical charge in response to incident light and may have a predetermined width and size.

In addition, the floating diode 130 may sequentially read out the electrical charge stored in the photodiode 120 in accordance with readout timing. Both the photodiode 120 and the floating diode 130 described above may be N-type impurity regions.

In addition, the first gate 140 and a second gate 150 may be formed on the front surface 111 of the semiconductor layer 110 to be spaced apart from each other. The first gate 140 and the second gate 150 may be formed to be spaced apart from each other in an insulating layer 160 and on the front surface 111 of the semiconductor layer 110. Here, the first gate 140 may be formed to vertically overlap the photodiode 120 or may be formed to at least partially overlap the photodiode 120. In addition, the first gate 140 may include a first insulating layer 141 on the front surface 111 of the semiconductor layer 110 and a first gate electrode 143 on the first insulating layer 141.

In addition, the first insulating layer 141 may be formed so that a surface thereof in contact with the first gate electrode 143 is not flat. Hereinafter, for convenience of explanation, the surface of the first insulating layer 141 that is in contact with the first gate electrode 143 is referred to as a "first surface" of the first insulating layer 141. The first surface of the first insulating layer 141 may be formed so that an end thereof adjacent to the floating diode 130 has the largest vertical thickness. As an example, the first surface of the first insulating layer 141 may have an inclined side so that the thickness thereof gradually increases in the direction toward the floating diode 130, but is preferable to have a stepped portion 141*a* stepped at a predetermined position in terms of manufacturing efficiency. When the first surface of the first insulating layer 141 is formed to be stepped, a plurality of stepped portions 141*a* may be formed to be spaced apart from each other as they extend toward the floating diode 130. That is, the first insulating layer 141 may be formed in a stepped shape so that the vertical thickness thereof increases discontinuously as it extends toward the floating diode 130. The formation of the stepped portion 141*a* in the first insulating layer 141 may be achieved by, for example, forming an insulating layer forming the first insulating layer 141 on the front surface 111 of the semiconductor layer 110, forming a photoresist pattern on the first insulating layer 141, and performing an etching process. The "etching process" may be a reactive ion etching process or a wet etching process, but the present disclosure is not limited thereto.

In addition, the first gate electrode 143 may be formed by, for example, a polysilicon layer, and may have an upper surface formed in a shape corresponding to the first surface of the first insulating layer 141. A lower portion of the first gate electrode 143 may be electrically connected to a wiring layer 161 in the insulating layer 160, which will be described later, and may be formed substantially flat, but the present disclosure is not limited thereto.

When the first gate electrode 143 is turned on in response to a first control signal, holes may be accumulated at the interface between the semiconductor layer 110 and the insulating layer 160 to form a pinning layer PL. Here, since the first gate electrode 143 and the first insulating layer 141 are formed to have a varying thickness in the horizontal direction, a formation depth of the pinning layer PL to the back surface 113 of the semiconductor layer 110 may become shallower toward the floating diode 130. Therefore, the electrical charge accumulated in the photodiode 120 can be easily transferred to a second gate 150, which will be described later.

The second gate 150 may be a transfer transistor, and may be formed on the front surface 111 of the semiconductor layer 110 in the insulating layer 160. The second gate 150 may be formed between the photodiode 120 and the floating diode 130, and may be formed to at least partially vertically overlap the photodiode 120. In addition, the second gate 150 may include a second insulating layer 151 on the front surface 111 of the semiconductor layer 110 and a second gate electrode 153 on the second insulating layer 151. As described above, when the first gate electrode 143 is turned in response to the first control signal, holes may be accumulated at the interface between the semiconductor layer 110 and the insulating layer 160 to form the pinning layer PL. Therefore, when the electrical charge accumulated in the photodiode 120 is transferred toward the second gate 150, which will be described later, and at the same time or thereafter, when the second gate 150 is turned on in response to a second control signal, the transferred electrical charge may be stored in the floating diode 130. Thereafter, the amount of electrical charge collected in the floating diode 130 may be converted into a voltage and read as a signal.

Hereinafter, the structure of a conventional image sensor 9 and the problems arising therefrom will be briefly described with reference to the accompanying drawings.

Figure 1:
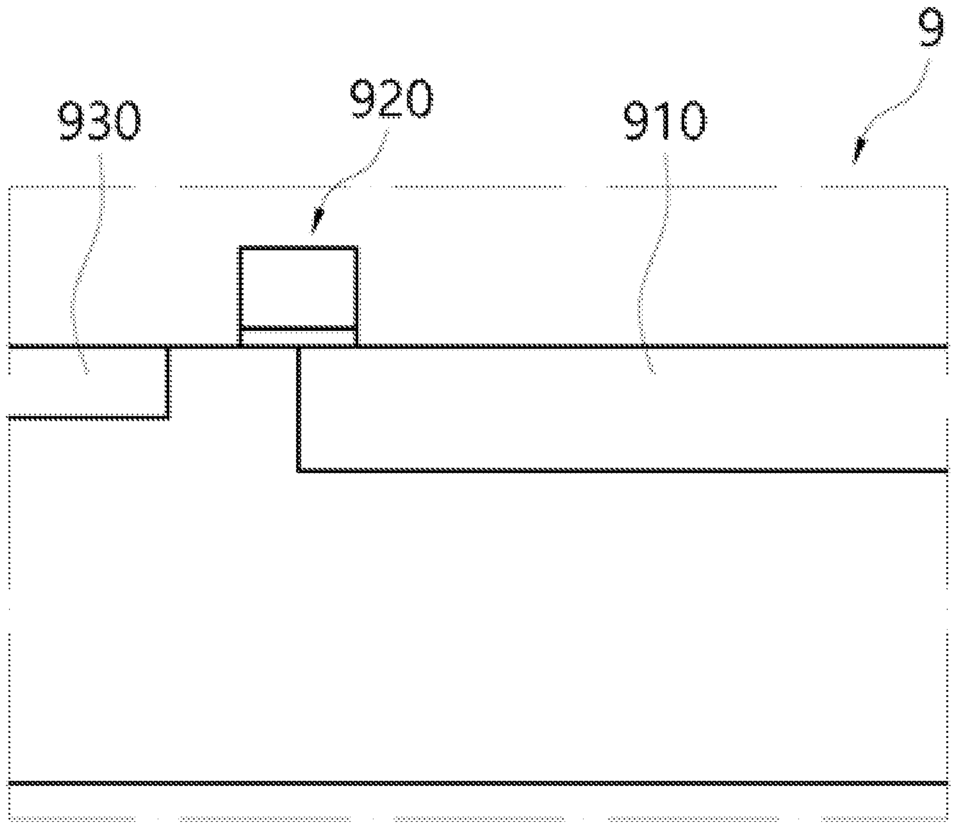
FIG. 1 PRIOR ART
FIG. 1 is a sectional view illustrating a conventional image sensor.

Referring to FIG. 1, when an exposure of a photodiode 910 of the conventional image sensor 9 is first started, the photodiode 910 converts incident light into an electrical charge and accumulates the electrical charge. Thereafter, a transfer gate 920 is turned on in response to a control signal, and the electrical charge accumulated in the photodiode 910 is transferred to a floating diffusion region 930 and is stored. Here, when a unit pixel region has a large size, that is, when the photodiode 910 has a width of a certain size or more, there is a limitation in transferring the electrical charge accumulated in the photodiode 910 far from the transfer gate 920 to the floating diffusion region 930. In other words, as the charge transfer path becomes longer, the charge transfer efficiency undesirably decreases.

To prevent this, when a pinning layer (not illustrated) is formed in the photodiode 910 through an ion implantation process, a loss in the area of the photodiode 910 is inevitable due to the pinning layer.

Referring to FIG. 3, in order to prevent the above problems, in the first embodiment of the present disclosure, the first gate electrode 143 and the first insulating film 141 are formed to have a varying thickness so that the formation depth of the pinning layer PL becomes shallower toward the floating diode 130. With this configuration, the electrical charge accumulated in the photodiode 120 can be easily transferred to the second gate 150, which will be described later. Therefore, even when the photodiode 120 has a width of a certain size or more, the pinning layer PL assists the transfer of the electrical charge so that the electrical charge can be easily transferred. In addition, since the pinning layer PL according to the present disclosure is not formed through an ion implantation process, no loss occurs in the area of the photodiode 120.

Next, the insulating layer 160 may be formed on the front surface 111 of the semiconductor layer 110. As described above, the first gate 140 and the second gate 150 may be formed in the insulating layer 160. The insulating layer 160 may be formed by, for example, any one oxide layer selected from the group consisting of BPSG, PSG, BSG, USG, TEOS, and HDP or a stacked layer in which at least two layers selected from the aforementioned group are mixed.

In addition, the wiring region 161 may be formed in the insulating layer 160. A plurality of wiring layers 161 may be stacked to form a multi-layer structure. Adjacent wiring layers 161 may be electrically connected to each other through a contact plug 163. In addition, each wiring layer 161 may be electrically or physically connected to the first gate 140, the second gate 150, and the floating diode 130. The wiring layer 161 may be formed by, for example, a single metal or an alloy layer in which different types of metals are mixed, and preferably includes, for example, an aluminum (Al) layer.

The contact plug 163 may be formed in the insulating layer 160 through a damascene process. In order to electrically connect the wiring layers 161 that are vertically stacked, the contact plug 163 may be formed by a conductive material, for example, selected from the group consisting of a polycrystalline silicon layer doped with impurity ions, a metal, and an alloy layer in which different types of metals are mixed.

In addition, a color filter part 171 may be formed on the back surface 113 of the semiconductor layer 110 in the pixel region P. Only a necessary color may be selected by corresponding color filters (red, green, blue) of the color filter part 171 from incident light entering through a lens part 175, which will be described later. The color selected may enter the photodiode 120 of a corresponding unit pixel region P1. The formation process of the color filter part 171 will be described. For example, a red color filter may be formed by applying a red photoresist on the back surface 113 of the semiconductor layer 110 and then exposing and developing it, and a green color filter may be formed by applying a green photoresist on a protective film on which the red color filter is formed and then exposing and developing it. Thereafter, a blue color filter may be formed by applying a blue photoresist and then exposing and developing it. The color filter part 171 may be formed in each unit pixel region P1.

In addition, a planarization layer 173 may be formed on the color filter part 171. The planarization layer 173 may include, for example, a silicon oxide layer.

In addition, the lens part 175 may be formed on the planarization layer 173. The lens part 175 may include a plurality of microlenses that focus light entering the back surface 113 of the semiconductor layer 110 on the photodiode 120 within a corresponding unit pixel region P1. The lens part 175 may be formed in the pixel region P, and, for example, may be formed to correspond to each unit pixel region P1.

Figure 4:
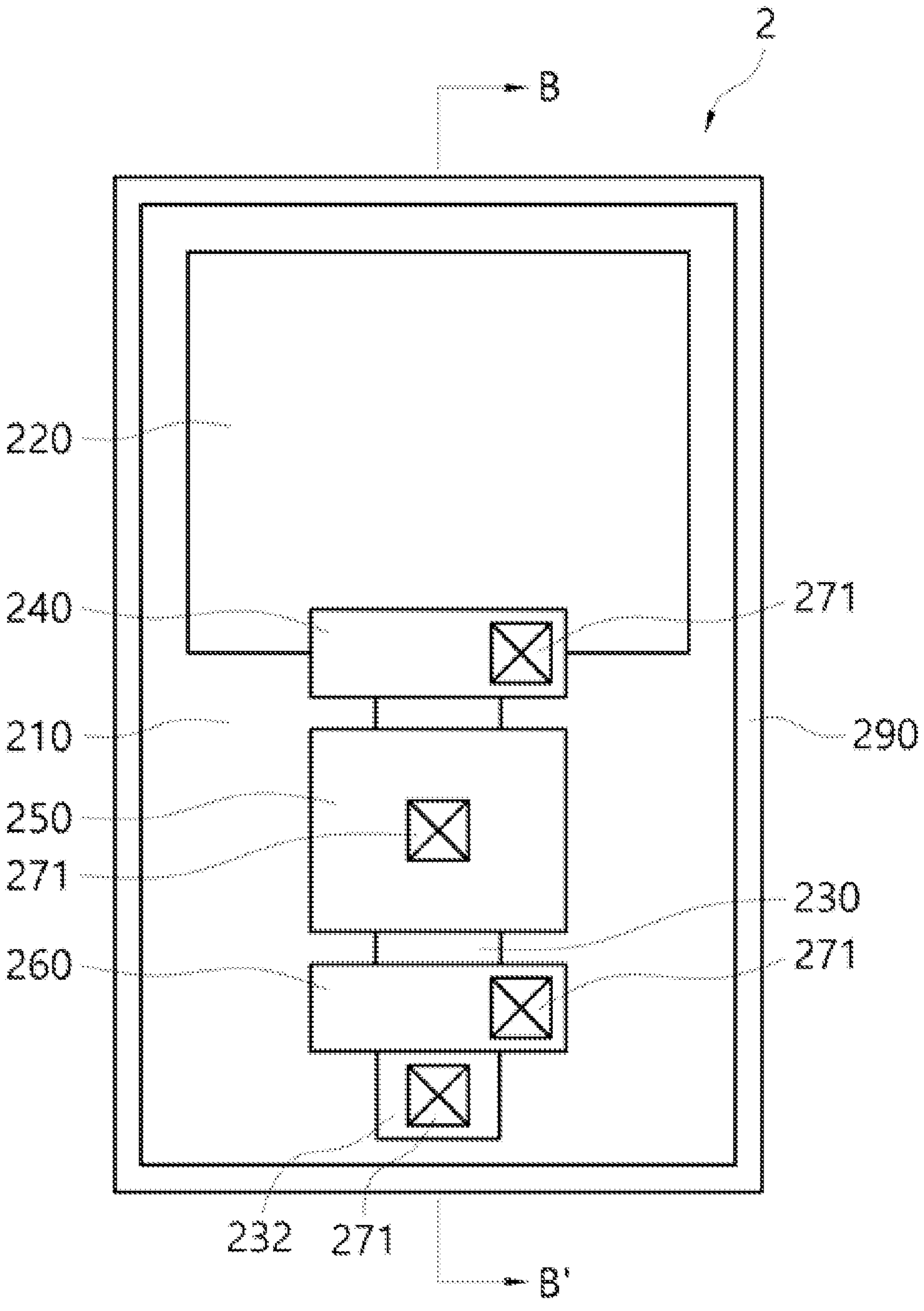
FIG. 4 is a plan view illustrating an image sensor according to a second embodiment of the present disclosure.
Figure 5:
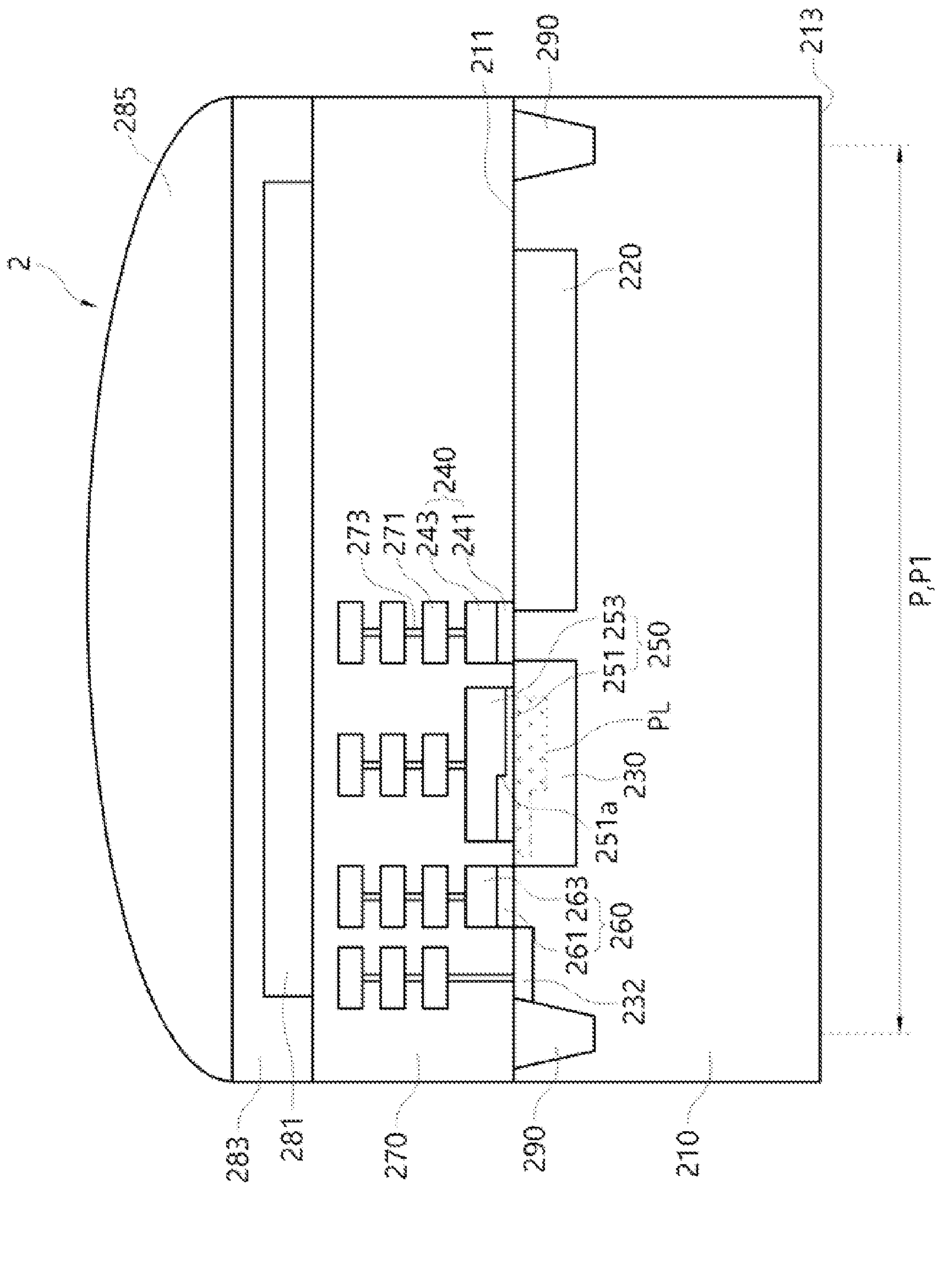
FIG. 5 is a sectional view taken along line B-B' of FIG. 4.

FIG. 4 is a plan view illustrating an image sensor 2 according to a second embodiment of the present disclosure. FIG. 5 is a sectional view taken along line B-B' of FIG. 4. In FIG. 4, for convenience of explanation, the structures of an insulating layer, a contact plug, a color filter part, a planarization layer, and a lens part are omitted.

Hereinafter, the image sensor 2 according to the second embodiment of the present disclosure will be described in detail with reference to the accompanying drawings. It should be noted that the image sensor 2 according to the second embodiment is a global shutter type frontside-illuminated image sensor.

Referring to FIGS. 4 and 5, the present disclosure relates to a frontside-illuminated image sensor 2. More particularly, the present disclosure relates to a frontside-illuminated image sensor 2, in which a second gate 250 with a varying thickness is formed on a storage diode 230, so that an electrical charge stored in the storage diode 230 can be easily transferred to a floating diode 232. When describing the second embodiment, a detailed description of the same components as those of the first embodiment will be omitted.

The structure of the frontside-illuminated image sensor 2 according to the second embodiment of the present disclosure will be described with reference to FIG. 5. First, a semiconductor layer 210 may be formed. The semiconductor layer 210 may include, for example, an epitaxial layer, and may be commonly applied to each unit pixel region P1. The semiconductor layer 210 may be, for example, a low concentration P-type layer formed on a substrate and may have a front surface 211 and a back surface 213. In addition, a device isolation layer 290 may be formed in the semiconductor layer 210 to define an active region. The device isolation layer 290 may be formed through, for example, a shallow trench isolation (STI) process, and may be formed to extend to a predetermined depth from the front surface 211 of the semiconductor layer 210 toward the back surface 213 thereof.

In addition, in each unit pixel region P1, a photodiode 220, the storage diode 230, and the floating diode 232 may be formed to be spaced apart from each other, and the photodiode 220, the storage diode 230, and the floating diode 232 may be formed on the front surface 211 of the semiconductor layer 210. The storage diode 230 may temporarily store an electrical charge accumulated in the photodiode 220, and may be an N-type impurity region.

In addition, a first gate 240, the second gate 250, and a third gate 260 may be formed on the front surface 211 of the semiconductor layer 210 to be spaced apart from each other. The first gate 240 may be a transfer transistor, and is substantially the same in structure and function as the second gate 150 according to the first embodiment except that it is upside down. The first gate 240 may be formed in an insulating layer 270 between the photodiode 220 and the storage diode 230, and may have a first insulating layer 241 and a first gate electrode 243.

In addition, the second gate 250 may be formed to vertically overlap the storage diode 230 or may be formed to at least partially overlap the storage diode 230. The second gate 250 is substantially the same in structure and function as the first gate 140 according to the first embodiment except that it is upside down. The second gate 250 may have a second insulating layer 251 adjacent to the storage diode 230 and a second gate electrode 253 on the second insulating layer 251. An upper surface of the second insulating layer 251 may be formed so that an end thereof adjacent to the floating diode 232 is thicker than at an end thereof adjacent to the first gate 240. That is, a surface of the second insulating layer 251 may have an inclined side so that the thickness thereof gradually increases in the direction away from the photodiode 220, and may have a stepped portion 251*a* stepped at a predetermined position. A pinning layer PL may be formed in the storage diode 230 by the second gate 250. The pinning layer PL may be formed so that a side thereof adjacent to the photodiode 220 is deeper in the semiconductor layer 210 than a side thereof adjacent to the floating diode 232.

In addition, the third gate 260 may be a reset transistor, and may be formed in the insulating layer 270 between the storage diode 230 and the floating diode 232. The third gate 260 may have a structure substantially the same or similar to that of the first gate 240, and may have a third insulating layer 261 and a third gate electrode 263, and a detailed description thereof is omitted.

The operation method for charge transfer will be briefly described. When an exposure of the photodiode 220 is first started, the photodiode 220 converts incident light into an electrical charge and accumulates the electrical charge. Thereafter, the first gate 240 is turned on in response to a first control signal, and the electrical charge accumulated in the photodiode 220 is transferred to the storage diode 230 and is temporarily stored. The first control signal is turned off thereafter, and after a predetermined time elapses, the second gate 250 is turned on in response to a second control signal, and the electrical charge stored in the storage diode 230 is transferred to a side adjacent to the third gate 260 within the storage diode 230. Thereafter, a third control signal is turned on, and the electrical charge temporarily stored in the storage diode 230 is transferred to the floating diode 232. The floating diode 232 then sequentially reads out the electrical charge stored in the storage diode 230.

Here, since the second gate 250 forming the pinning layer PL is formed on the storage diode 230 rather than the photodiode 220, the light reception efficiency of the photodiode 220 can be prevented from being reduced In addition, even when the storage diode 230 has a width of a certain size or more, the pinning layer PL assists the transfer of the electrical charge so that the electrical charge can be easily transferred. Lastly, since the pinning layer PL according to the present disclosure is not formed through an ion implantation process, no loss occurs in the area of the storage diode 230.

Next, the insulating layer 270 may be formed on the front surface 211 of the semiconductor layer 210. As described above, the first gate 240, the second gate 250, and the third gate 260 may be formed in the insulating layer 270. In addition, a wiring layer 271 and a contact plug 273 may be formed in the insulating layer 270. The insulating layer 270, the wiring layer 271, and the contact plug 273 may be formed through the same process as the insulating layer 160 and the wiring layer 161 according to the first embodiment, and thus a detailed description thereof is omitted. Here, it is preferable that the wiring layer 271 and the contact plug 273 are formed at a side that does not overlap the photodiode 220 to prevent the light reception efficiency of the photodiode 220 from being reduced. Each wiring layer 271 and each contact plug 273 may be electrically connected to the first gate 240 to the third gate 260.

In addition, a color filter part 281, a planarization layer 283, and a lens part 285 may be formed on a front surface of the insulating layer 270. Since the color filter part 281, the planarization layer 283, and the lens part 285 are substantially the same as those according to the first embodiment, a detailed description thereof is omitted.

The foregoing detailed description may be merely an example of the present disclosure. Also, the inventive concept is explained by describing the preferred embodiments and will be used through various combinations, modifications, and environments. That is, the inventive concept may be amended or modified without departing from the scope of the technical idea and/or knowledge in the art. The foregoing embodiments are for illustrating the best mode for implementing the technical idea of the present disclosure, and various modifications may be made therein according to specific application fields and uses of the present disclosure. Therefore, the foregoing detailed description of the present disclosure is not intended to limit the inventive concept to the disclosed embodiments.

What is claimed is:

1. An image sensor, comprising:

a semiconductor layer having a front surface and a back surface;

a photodiode and a floating diode disposed apart from each other in the semiconductor layer;

a first gate disposed on the front surface of the semiconductor layer and a front surface of the photodiode;

a second gate disposed on the front surface of the semiconductor layer and in an insulating layer, the second gate being configured to serve as a transfer transistor;

the insulating layer disposed on the front surface of the semiconductor layer;

a wiring layer disposed in the insulating layer; and a pinning layer induced in the semiconductor layer at an interface between the semiconductor layer and the insulating layer when the first gate is turned on;

wherein the first gate comprises a first insulating layer disposed on the front surface of the semiconductor layer; and a first gate electrode disposed on a surface of the first insulating layer, wherein the first insulating layer has a greater vertical thickness at a side adjacent to the floating diode than at a side farther from the floating diode, and wherein the pinning layer has a shallower depth toward the back surface of the semiconductor layer at a portion adjacent to the floating diode than at a portion farther from the floating diode.

2. The image sensor of claim 1, wherein the second gate is disposed in the insulating layer between the photodiode and the floating diode.

3. The image sensor of claim 1, wherein the first insulating layer has a largest vertical thickness at an end of the first insulating layer adjacent to the floating diode.

4. The image sensor of claim 1, wherein the surface of the first insulating layer has a stepped shape.

5. The image sensor of claim 1, wherein the surface of the first insulating layer has a stepped portion stepped at a predetermined position.

6. The image sensor of claim 1, further comprising:

a color filter disposed on the back surface of the semiconductor layer;

a planarization layer disposed on the color filter; and a lens disposed on the planarization layer.

7. The image sensor of claim 1, wherein the pinning layer is located in the photodiode.

8. The image sensor of claim 1, wherein the photodiode has a greater vertical thickness than the floating diode.

* * * * *